(12) United States Patent
Himpe

(10) Patent No.: US 8,854,082 B2
(45) Date of Patent: Oct. 7, 2014

(54) DEGLITCHER WITH PROGRAMMABLE HYSTERESIS

(75) Inventor: Vincent Himpe, San Jose, CA (US)

(73) Assignee: STMicroelectronics, Inc., Coppell, TX (US)

( * ) Notice: Subject to any disclaimer, the term of this patent is extended or adjusted under 35 U.S.C. 154(b) by 952 days.

(21) Appl. No.: 12/980,534

(22) Filed: Dec. 29, 2010

(65) Prior Publication Data

US 2012/0169376 A1 Jul. 5, 2012

(51) Int. Cl.
*G01R 29/02* (2006.01)
*H03K 9/08* (2006.01)
*H03K 5/1252* (2006.01)

(52) U.S. Cl.
CPC .................................. *H03K 5/1252* (2013.01)
USPC .............. 327/34; 327/172; 375/232; 713/500

(58) Field of Classification Search
CPC .. G01R 31/3177; G01R 35/00; G01R 35/005; G01R 31/318572; H04L 25/03885; H04L 25/03343; H04L 2025/03363; H04L 2025/03802; H04L 25/028; G06F 1/3296; G06F 13/00; G06F 13/1689; G06F 13/4243; G06F 1/12; G06F 1/26
USPC ........ 327/28, 31, 34, 172, 175; 713/500–503; 375/232, 295, 340; 714/727; 324/601
See application file for complete search history.

(56) References Cited

U.S. PATENT DOCUMENTS

| | | | |
|---|---|---|---|
| 5,815,690 A | 9/1998 | Kowert et al. | |
| 7,017,069 B2 * | 3/2006 | Kudo et al. | 713/500 |
| 7,043,657 B1 * | 5/2006 | Yang et al. | 713/503 |
| 7,362,152 B2 | 4/2008 | Figoli | |
| 7,714,626 B2 | 5/2010 | Kris | |
| 8,410,819 B2 | 4/2013 | Himpe | |

* cited by examiner

*Primary Examiner* — Lincoln Donovan
*Assistant Examiner* — Diana J Cheng
(74) *Attorney, Agent, or Firm* — Gardere Wynne Sewell LLP

(57) ABSTRACT

Disclosed is a deglitcher circuit having a programmable hysteresis. The deglitcher samples a received input signal, wherein the input signal may include one or more glitches. Responsive to a change in state of the sampled input signal, the deglitcher counts the number of samples of the changed state of the input signal. The count value increments with each sampled changed state, and decrements with each sampled original state of the input signal. When the count value reaches a threshold, the state of the output signal is changed. The output signal of the disclosed deglitcher circuit provides an accurate, glitch-free reconstruction of the sampled input signal. Additionally, the disclosed deglitcher circuit reduces the number of memory elements required for a given number of samples of the input signal, thereby allowing for a larger number of samples to be taken without necessarily having to increase the memory elements required by the deglitcher.

41 Claims, 5 Drawing Sheets

DEGLITCHER WITH PROGRAMMABLE HYSTERESIS

BACKGROUND

1. Technical Field

The present invention relates generally to integrated circuits designed to filter an input signal and, more specifically, to an integrated circuit having a programmable hysteresis for receiving an input signal and generating a time-shifted, glitch-free version of the input signal.

2. Introduction

In general, deglitching circuitry is designed to filter one or more unwanted transients in an input signal, also known as glitches or noise, to produce an output signal that replicates the input signal without the glitches. Conventional deglitching circuitry typically implements a chain of flip-flops clocked on a fixed time interval for sampling the input signal at each clock cycle, wherein each sample taken by a flip-flop is stored as a single bit using the flip-flop or some other memory element. For example, to sample an input signal for 10 clock cycles, a conventional deglitcher requires 10 flip-flops—one for each sample during the interval. The sampling occurs for the 10 clock cycles, and each sample is stored in a flip-flop (or other memory element). The output signal is then constructed after the sampling is complete using the data stored in the flip-flops. However, as the sampling interval is increased, the need for more resources (i.e., flip-flops and/or other memory elements) also increases. Naturally, greater demand for more expansive sampling causes the conventional deglitcher to become increasingly space-consuming and expensive. Therefore, there exists a need for deglitching circuitry that can operate at high sampling rates and accurately reconstruct input signals to remove glitches while reducing the resources required for increased sampling intervals.

SUMMARY

The present disclosure provides a deglitcher circuit having a programmable hysteresis. The deglitcher is operable to sample a received input signal, wherein the input signal may include one or more glitches. Responsive to a change in state of the sampled input signal, the deglitcher circuit counts the number of samples of the changed state of the input signal. When the number of samples of the changed state of the input signal reaches a threshold, the state of the output signal is changed. The output signal of the disclosed deglitcher circuit provides an accurate, glitch-free reconstruction of the sampled input signal.

In accordance with an embodiment of the present disclosure, the count value increments with each sampling of the input signal occurring at the changed state, and decrements with each sampling of the input signal occurring at the original state. When the count value meets a threshold, the state of the output signal is changed. The disclosed deglitcher circuit reduces the number of memory elements required for a given number of samples of the input signal, thereby allowing for a larger number of samples to be taken without necessarily having to increase the memory elements required by the deglitcher.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures, in which like reference numbers indicate similar parts, and in which.

DETAILED DESCRIPTION OF THE DRAWINGS

Figure 1:
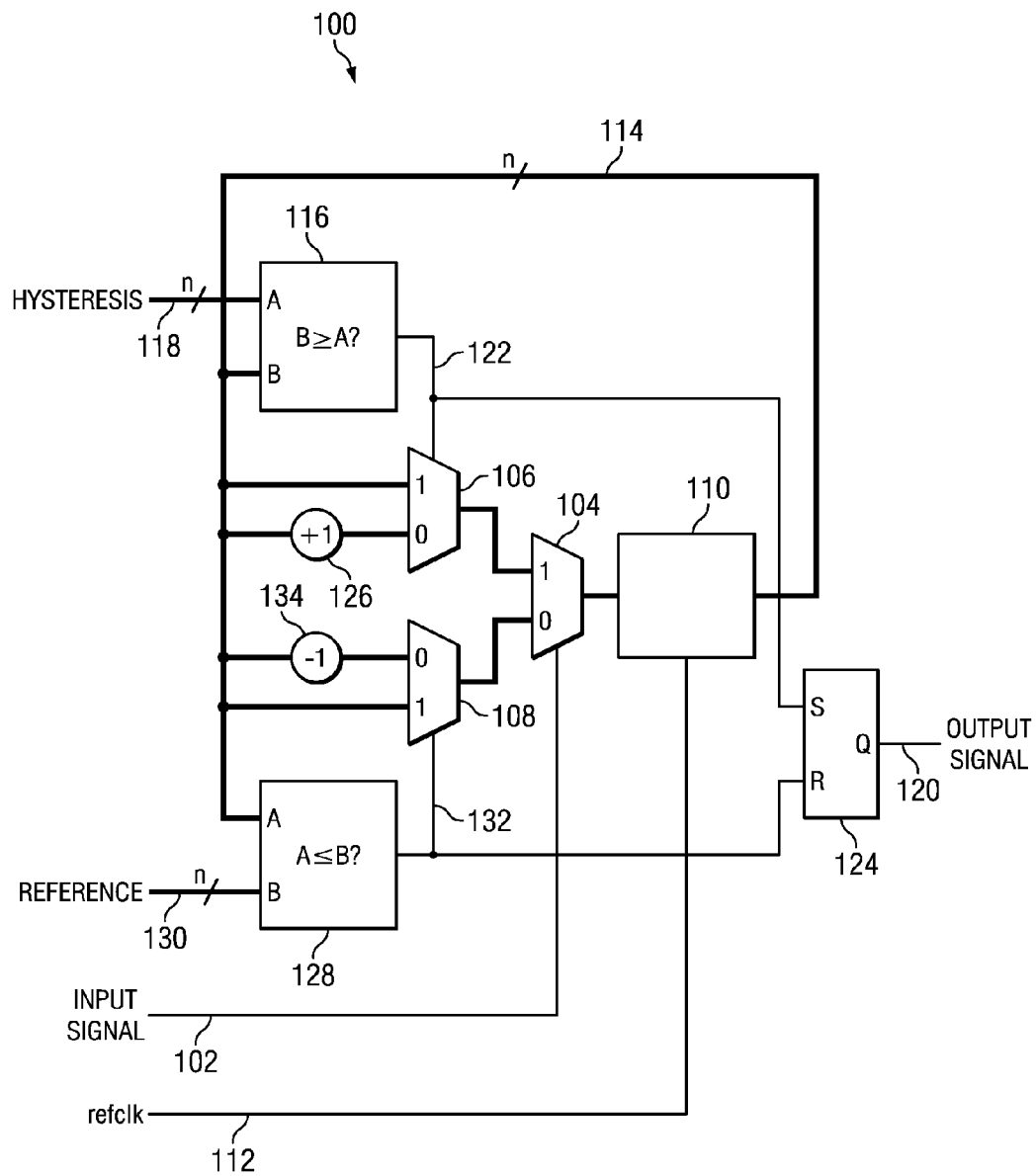
FIG. 1 illustrates an circuit diagram representing an example embodiment of the present disclosure.

The present disclosure provides a deglitcher circuit operable to produce a time-shifted, glitch-free reconstruction of an input signal. Responsive to a change in state of the sampled input signal, the disclosed deglitcher circuit counts the number of samples of the input signal at the changed state. The count value is stored in a register (also referred to herein as memory, memory element, or counter). For each sample at the changed state, the count value is incremented. For each sample at the original state, the count value is decremented. A change in the state of the output signal is then triggered based on the count value (for example, when the count value exceeds a threshold).

The disclosed deglitcher circuit includes a programmable hysteresis for defining and/or adjusting threshold values used to determine when a change in the state of the output signal is triggered by the count value. The hysteresis defines an upper threshold (referred to herein as a hysteresis value) and a lower threshold (referred to herein as a reference value), wherein the difference between the upper and lower threshold values determines the minimum count value that is required to trigger a change in the state of the output signal. More specifically, the difference between the threshold values determines how many more samples must occur at the changed state than at the original state in order to trigger a change in the state of the output signal. As such, a change in state of the output signal is time-shifted by at least the number of clock cycles occurring between the upper and lower threshold values. In other words, the output signal is time-shifted by the difference between the hysteresis value and the reference value. It should be understood that once the state of the output signal has been changed, the input signal is considered to be stable, and thus, the state of the input signal that was previously considered the "changed state" now becomes the original state for purposes of determining a subsequent change in the state of the output signal. Responsive to a sampling of the new changed state of the input signal, the deglitcher circuit then counts down to the lower threshold value, wherein now a sampled changed state input signal decrements the count and a sampled original state input signal increments the count.

A sampling of the input signal at the changed state may be regarded as a glitch, or noise, depending on how it affects the value in the counter. If the sampling of the input signal at the changed state does not affect a change in the state of the output signal within a number of samples equal to the difference between the upper and lower thresholds, then the sampling of the input signal at the changed state is considered a glitch, and is not reconstructed on the output signal. In addition to producing a time-shifted, glitch-free reconstruction of the input signal, the disclosed deglitcher circuit reduces the number of memory elements required for a given number of samples, thereby allowing for a larger number of samples to be taken without necessarily having to increase the memory elements required by the deglitcher.

The following disclosure provides one or more example embodiments of the disclosed deglitcher circuit. For instances within a particular embodiment in which the original state of the input signal is logic low, the counter must reach the upper threshold, or hysteresis value, in order to trigger a change in the state of the output signal. For instances within a particular embodiment in which the original state of the input single is logic high, the counter must reach the lower threshold, or reference value, in order to trigger a change in the state of the output signal. Additional embodiments and alternate implementations of the circuit described below may be considered within the scope of the present disclosure as defined by the claims below. For example, in some embodiments, the counter may always count up to a threshold value. In such an embodiment, the counter resets after triggering a change in the state of the output signal.

FIG. 1 illustrates an example embodiment of a deglitcher circuit 100 in accordance with the present disclosure, wherein the deglitcher 100 receives an input signal 102 and outputs 120 a time-shifted, glitch-free reconstruction of the input signal 102. As shown in FIG. 1, the input signal 102 controls an input multiplexer 104. Connected at a first input of the input multiplexer 104 is an output from a hysteresis multiplexer 106, and connected at a second input is an output from a reference multiplexer 108. When the input signal 102 is logic high, the input multiplexer 104 loads the output from the hysteresis multiplexer 106 into a register 110, and when the input signal 102 is logic low, the input multiplexer 104 loads the output from the reference multiplexer 108 into the register 110. In an embodiment of the present disclosure, the multiplexers 104, 106, and 108 are multibit multiplexers connected by multibit buses.

The register 110 illustrated in FIG. 1 may be an n-bit wide memory device operable to represent a value ranging from 0 to $2^n-1$ (or any other range of values having a delta of $2^n$). The width of the register 110 and, thus, the value of n, may be determined based upon the number of samples required to sufficiently filter a desired pulse width of the input signal 102. For example, as explained in greater detail below, for the deglitcher 100 of FIG. 1 to sufficiently filter a 30 nS pulse width of the input signal 102 with a 1 MHz clock, the register 110 would need to be able to store a value sufficient to represent 30 samples (i.e., $2^n \geq 30$). In this case, the register 110 would need to be at least five bits wide (i.e., n=5) to support the 30 samples (since $2^n=32$ for n=5). In contrast, a conventional deglitcher circuit would require 30 memory elements to record the 30 samples. Thus, a deglitcher using the register 110 provided in this example uses nearly 80% less memory than a conventional deglitcher to sample the same input signal 102.

Referring back to FIG. 1, the deglitcher 100 includes a clock signal 112 coupled to the register 110. When activated by the clock signal 112, the register 110 stores the multibit data received from the input multiplexer 104 and presents this data on a data bus 114. Thus, the input signal 102 is sampled on the clock signal 112. A hysteresis comparator 116 compares the data on the bus 114 with a hysteresis value 118. The hysteresis value 118 is a user-programmable input that sets an upper threshold for determining an acceptable upper limit for indicating when the input signal 102 should be represented as logic high by the reconstructed output signal 120. When the value stored in the register 110 is greater than or equal to the hysteresis value 118, the output signal 122 of the hysteresis comparator 116 is logic high, otherwise the hysteresis comparator output signal 122 is logic low. The output signal 122 from the hysteresis comparator 116 is received at both the control input of hysteresis multiplexer 106 and the set input of an output flip-flop 124.

Connected at a first input of the hysteresis multiplexer 106 is the data bus 114, and connected at a second input is an incrementation 126 of the multibit data on the bus 114. When the hysteresis comparator output signal 122 is logic high, the hysteresis multiplexer 106 couples the data on the bus 114 to the input of the input multiplexer 104. When the hysteresis comparator output signal 122 is logic low, the hysteresis multiplexer 106 couples the incremented data bus value 126 to the input of the input multiplexer 104. In other words, when the value stored in the register 110 and presented on the data bus 114 is greater than or equal to the hysteresis value 118, the hysteresis multiplexer 106 selects the value on the data bus 114 as its output. When the value in the register 110 is less than the hysteresis value 118, the value on the data bus 114 is incremented, and the incremented value 126 is selected as the output of the hysteresis multiplexer 106. Therefore, in accordance with the present embodiment, when the sampled input signal 102 is logic high, the input multiplexer 104 loads (with each clock cycle 112) either the value on the data bus 114, or an incremented data bus value 126, into the register 110. If the value stored in the register 110 is greater than or equal to the hysteresis value 118, then the value on the data bus 114 is loaded into the register 110 at the next clock cycle 112. If the value stored in the register 110 is less than the hysteresis value 118, then the incremented data bus value 126 is loaded into the register 110 at the next clock cycle 112. Simply put, when the sampled input signal 102 is logic high, the value stored in the register 110 at the next clock cycle will remain the same when the value on the data bus 114 is greater than or equal to the hysteresis value 118, otherwise, the value stored in the register 110 is incremented at the next clock cycle.

The data on the bus 114 is also received at a reference comparator 128, wherein the reference comparator 128 compares the data on the bus 114 with a reference value 130. The reference value 130 is a user-programmable input that sets a lower threshold for determining an acceptable lower limit to indicate when the input signal 102 should be represented as logic low by the reconstructed output signal 120. When the value stored in the register 110 is less than or equal to the reference value 130, the output signal 132 of the reference comparator 128 is logic high, otherwise the reference comparator output signal 132 is logic low. The output signal 132 from the reference comparator 128 is received at both the control input of the reference multiplexer 108 and the reset input of the output flip-flop 124.

Connected at a first input of the reference multiplexer 108 is the data bus 114, and connected at a second input is a decrementation 134 of the multibit data on the bus 114. When the reference comparator output signal 132 is logic high, the reference multiplexer 108 couples the data on the bus 114 to the input of the input multiplexer 104. When the reference comparator output signal 132 is logic low, the reference multiplexer 108 couples the decremented multibit data bus value 134 to the input of the input multiplexer 104. In other words, when the value stored in the register 110 on the clock cycle 112 (and presented at the data bus 114) is less than or equal to the reference value 130, the reference multiplexer 108 selects the value on the data bus 114 as its output at that clock cycle 112. When the value in the register 110 is greater than the reference value 130, the value on the data bus 114 is decremented, and the decremented value 134 is selected as the output of the reference multiplexer 108. Therefore, when the sampled input signal 102 is logic low at a given clock cycle 112, the input multiplexer 104 loads (at that clock cycle 112) into the register 110 either the value on the data bus 114, or a decremented data bus value 134. If the value stored in the register 110 at the clock cycle 112 is less than or equal to the reference value 130, then the value loaded in the register 110 at that clock cycle 112 is the value on the data bus 114; if the value in the register 110 is greater than the reference value 130, then the decremented data bus value 134 is loaded into the register 110 at the clock cycle 112. Simply put, when the sampled input signal 102 is logic low, the value stored in the register 110 at the next clock cycle will remain the same when the value on the data bus 114 is less than or equal to the reference value 130, otherwise, the value stored in the register 110 is decremented at the next clock cycle.

As stated above, the output flip-flop 124 receives both the hysteresis comparator output signal 122 (at the set input) and the reference comparator output signal 132 (at the reset input), and outputs a time-shifted, glitch-free reconstruction of the input signal 102. When the hysteresis comparator output signal 122 goes high, the output flip-flop 124 is set, and the output signal 120 transitions to logic high. When the reference comparator output signal 132 goes high, the output flip-flop 124 is reset, and the output signal 120 transitions to logic low. When neither the hysteresis comparator output signal 122 nor the reference comparator output signal 132 are logic high, the output signal 120 remains in its current state. Therefore, the output signal 102 remains unchanged until the output flip-flop 124 is either set or reset. The output flip-flop 124 may be fed an initial state (i.e., set or reset) to determine the initial value of the output signal 120 (i.e., the value of the output signal 120 upon reset, or clock cycle 0). In accordance with the embodiments described herein, the initial state of the output flip-flop 124 is reset, and thus, the initial output signal 120 is logic low. As previously mentioned, the time shift of the output signal 120 is dependent upon the difference between the hysteresis value 118 and the reference value 130.

It should be appreciated by those skilled in the art that the disclosed deglitcher circuit 100 may be designed such that the register 110 contains any value upon reset (i.e., clock cycle 0) of the deglitcher circuit 100. As such, the circuit 100 may be biased toward a logic high or logic low output signal 120 upon reset. For example, the deglitcher 100 may be designed such that, upon reset, the register 110 contains a value greater than or equal to the hysteresis value 118. In this example, the deglitcher circuit 100 is biased toward a logic high output signal 120 since, at reset, the output signal 120 is logic high. Alternatively, the deglitcher 100 may be designed so that the register 110 contains a value less than or equal to the reference value 130 upon reset. In this example, the deglitcher circuit 100 is biased toward a logic low output signal 120 since, at reset, the output signal 120 is logic low. In another example, a user may design the deglitcher 100 such that, upon reset, the register 110 contains a value that is greater than the reference value 130 and less than the hysteresis value 118. In this example, the output signal 120 would be determined by the initial condition of the output flip-flop 124 (i.e., set or reset), and the deglitcher 100 would be biased toward whichever condition the value in the register 110 is nearest. If the value in the register 110 is closer to the hysteresis value 118 at reset, then the deglitcher 100 is biased toward a logic high output signal 120. If the value in the register 110 is closer to the reference value 130 at reset, then the deglitcher 100 is biased toward a logic low output signal 120. If the difference between the register value and the hysteresis value 118 is the same as the difference between the register value and the reference value 130, then the deglitcher 100 is not biased toward any output signal condition.

Figure 2A:
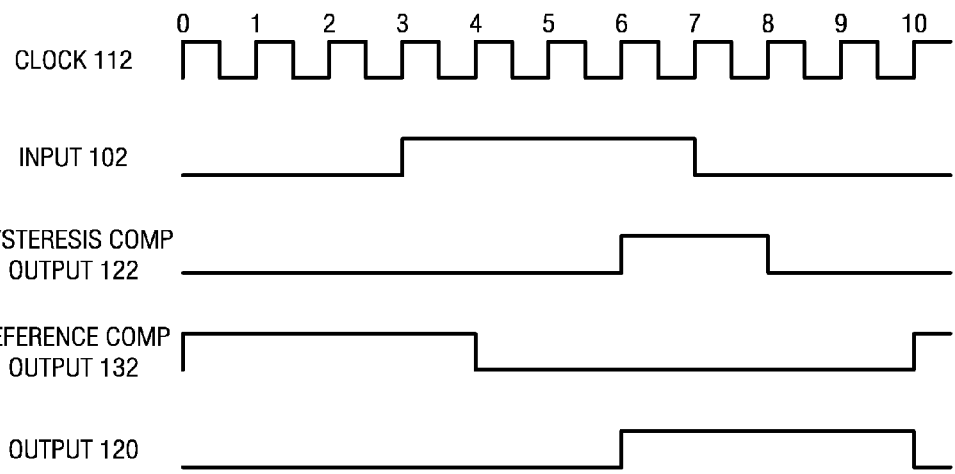
FIG. 2A illustrates a waveform drawing of an example input signal without glitches, a clock signal, a hysteresis comparator output signal, a reference comparator output signal, and an output signal.
Figure 2B:
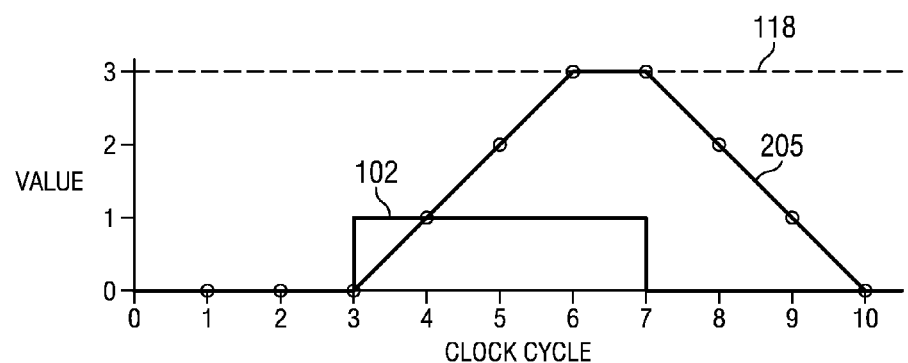
FIG. 2B illustrates a graph of the input signal waveform of FIG. 2A as well as a graph of the corresponding value stored in the register.
Figure 3A:
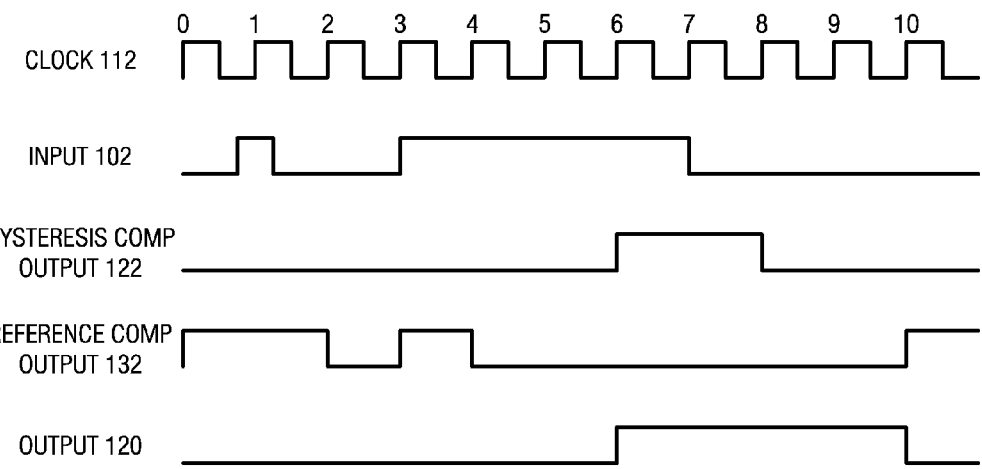
FIG. 3A illustrates a waveform drawing of an example input signal having a positive glitch, a clock signal, a hysteresis comparator output signal, a reference comparator output signal, and an output signal.
Figure 3B:
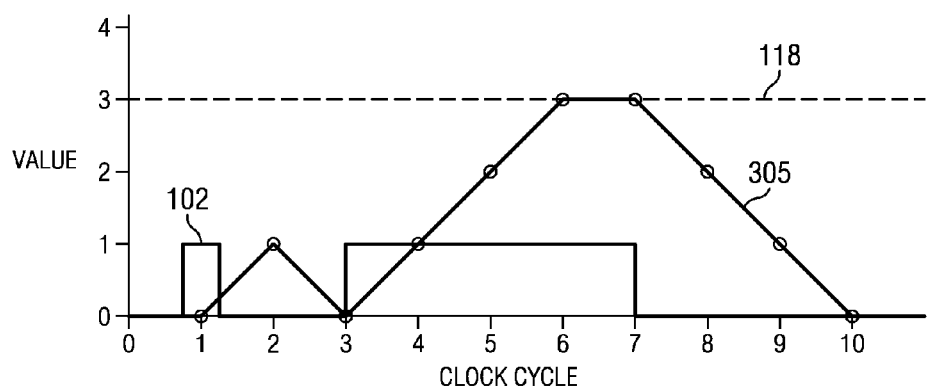
FIG. 3B illustrates a graph of the input signal waveform of FIG. 3A as well as a graph of the corresponding value stored in the register.
Figure 4A:
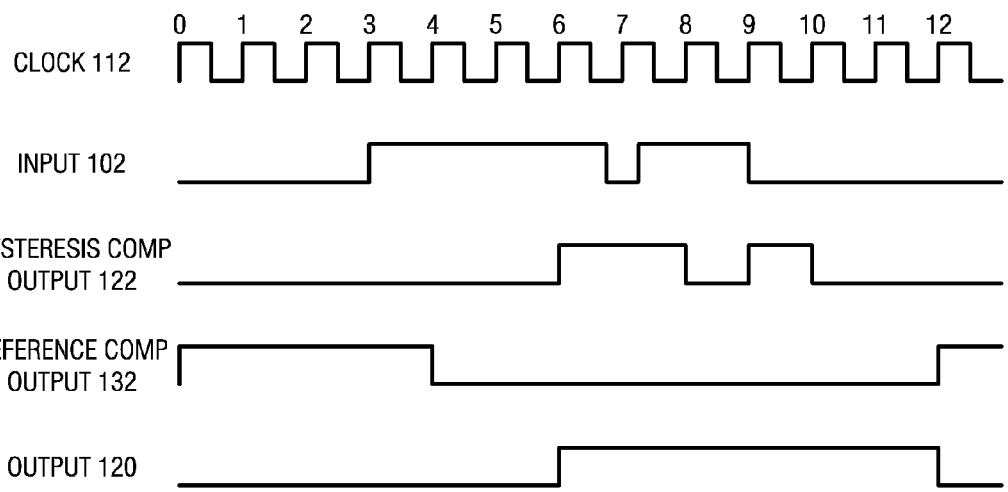
FIG. 4A illustrates a waveform drawing of an example input signal having a negative glitch, a clock signal, a hysteresis comparator output signal, a reference comparator output signal, and an output signal.
Figure 4B:
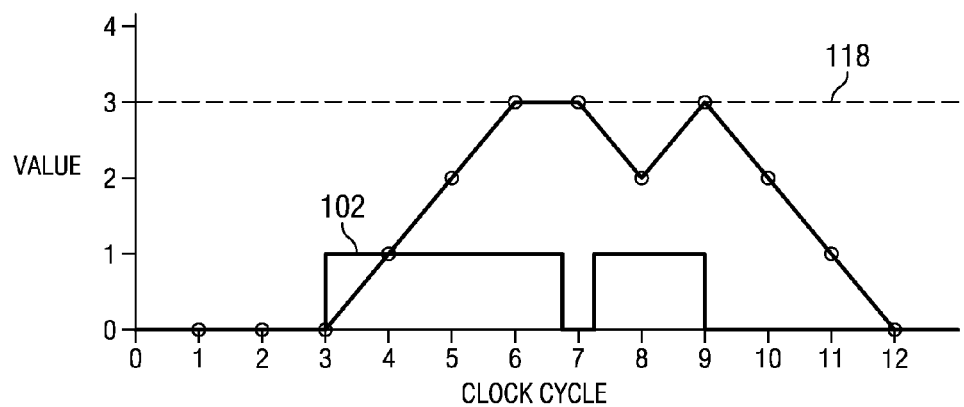
FIG. 4B illustrates a graph of the input signal waveform of FIG. 4A as well as a graph of the corresponding value stored in the register.

Reference is now made to FIGS. 2A, 2B, 3A, 3B, 4A, and 4B for purposes of discussing example implementations of the disclosed deglitcher circuit 100 illustrated in FIG. 1. FIGS. 2A, 3A, and 4A each illustrate a waveform drawing of an example input signal 102, a clock signal 112, a hysteresis comparator output signal 122, a reference comparator output signal 132, and an output signal 120. FIGS. 2B, 3B, and 4B each illustrate a graph of the input signal 102 waveform shown in FIGS. 2A, 3A, and 4A, respectively, as well as the register value (i.e., the count value, or, the value stored in the register 110) corresponding to the example waveforms shown in respective FIGS. 2A, 3A, and 4A. In accordance with the example embodiments illustrated in FIGS. 2A, 2B, 3A, 3B, 4A, and 4B, the register 110 stores values ranging from 0 to 3. Therefore, the register 110 is at least two bits wide since, n=2 for $3 \le 2^n - 1$. The register 110 used in the deglitcher circuit 100 provided in these examples only requires two bits of storage, whereas a conventional deglitcher circuit would require three bits to store the same range of values. As such, these examples illustrate that the disclosed deglitcher circuit 100 requires less memory than conventional deglitcher circuits.

In the example embodiments shown in FIGS. 2A, 2B, 3A, 3B, 4A, and 4B, the register 110 has a value of zero upon reset (i.e., clock cycle 0), and the reference value 130 and hysteresis value 118 are zero and three, respectively. As previously stated, the hysteresis value 118 and reference value 130 may be dynamically assigned by a user to set upper and lower thresholds. The difference between the upper and lower threshold values determines how many more samples must occur at the changed state than at the original state of the input signal in order to trigger a change in the state of the output signal. Thus, in accordance with the embodiments illustrated in FIGS. 2A, 2B, 3A, 3B, 4A, and 4B, the difference between the upper and lower thresholds is a value of three, which represents the minimum number of samples that must be taken at the changed state than at the original state in order to trigger a change in the state of the output signal. Therefore, once a changed state of the input signal 102 is sampled, the total number of samples taken at the input signal's changed state must be at least three more than the number of samples taken at the input signal's original state in order to trigger a change in the state of the output signal 120.

The graphs provided in FIGS. 2A and 2B represent operation of the example deglitcher circuit 100 for a period of 10 clock cycles. The input signal 102 shown in FIG. 2A provides no glitches in order to illustrate that the disclosed deglitcher circuit 100 provides an accurate, time-shifted reconstruction of the input signal 102. At clock cycle 0, the input signal 102 is low, the value 305 (zero) stored in the register 110 is presented on the data bus 114, and the input multiplexer 104 of FIG. 1 selects the output from the reference multiplexer 108. The register value 205 (zero) presented on the data bus 114 is equal to the reference value 130 (zero), so the reference comparator output signal 132 is logic high, which resets the output flip-flop 124, thus outputting a low output signal 120, as shown in FIG. 2A. In response to the high reference comparator output signal 132, the reference multiplexer 108 selects the value on the data bus 114 (zero) as its output, which is then loaded into the register 110 by the input multiplexer 104. The input signal 102 remains low for clock cycles 1 and 2, so the process repeats as described above, and the output signal 120 remains logic low, as shown in FIG. 2A.

At clock cycle 3, the value (zero) loaded in the register 110 in the previous clock cycle is stored in the register 110 (see line 205 in FIG. 2B), and the input signal 102 goes high. The high input signal 102 is a "changed state" of the input signal 102, so the circuit begins the counting the changed state samples to determine if the state of the output signal 120 should be changed. Since the input signal 102 is logic high, the input multiplexer 104 selects the output from the hysteresis multiplexer 106. The register value 205 (zero) presented on the data bus 114 is less than the hysteresis value 118 (three), so the hysteresis comparator output signal 122 is logic low, as shown in FIG. 2A. As such, the hysteresis multiplexer 106 selects the incremented data bus value 126 (one) as its output, which is then loaded into the register 110 by the input multiplexer 104. Although the input signal 102 is logic high, the reference comparator output signal 132 remains logic high since the value 205 stored in the register 110 is less than or equal to the reference value 130. As such, the output flip-flop 124 remains reset and, therefore, maintains the low output signal 120, as shown in FIG. 2A.

It should be noted that, in this example embodiment (and those corresponding to FIGS. 3A, 3B, 4A, and 4B), the value 205 in the register 110 is stored at the rising edge of the clock signal 112. Therefore, an incrementation or decrementation of the register value 205 is only loaded into the register 110 during the current clock cycle and, thus, will not be stored in the register 110 (and reflected in the graph in FIG. 2B) until the rising edge of the next clock cycle. Although the present embodiment illustrates a deglitcher circuit 100 synchronized with the rising edge of the clock signal 112, the present disclosure is not limited to this, or other, user-defined preferences provided herein. Therefore, various changes and alternate implementations of the present disclosure may be made without departing from the scope of the disclosure as set forth in the claims below. For example, the data loaded in the register 110 during a clock cycle may be stored in the register 110 at the end of the current clock cycle.

At clock cycle 4, the value 305 stored in the register 110 is now greater than the reference value 130 but less than the hysteresis value 118. Therefore, both the hysteresis comparator output signal 122 and reference comparator output signal 132 are logic low. Since both inputs to the output flip-flop 124 are logic low, the flip-flop 124 maintains its current output, which is the low output signal 120 resulting from the reset condition caused by the high reference comparator output signal 132 occurring at clock cycle 3. Since the input signal 102 is logic high at clock cycle 4 and the hysteresis comparator output signal 122 is logic low, the value 205 stored in the register 110 is incremented at the next clock cycle (i.e., clock cycle 5). The input signal 102 remains logic high for clock cycle 5, so the process repeats as described in accordance with clock cycle 4, and the output signal remains logic low as illustrated in FIG. 2A.

At clock cycle 6, the value 305 stored in the register 110 equals the hysteresis value 118 causing the hysteresis comparator output signal 122 to go high, as shown in FIG. 2A. When this happens, for subsequent clock cycles in which the input signal 102 continues to be logic high, the register value 205 remains equal to the hysteresis value 118. Therefore, the hysteresis comparator output signal 122 remains logic high, and the hysteresis multiplexer 106 continues to output the value on the data bus 114, and thus, the register value 205 remains unchanged while the input signal 102 is logic high. When the hysteresis comparator output signal 122 goes high at clock cycle 6, this triggers a set condition at the output flip-flop 124, which results in a high output signal 120. The changed state (logic high) now becomes the original state for purposes of determining a subsequent change in the state of the output signal 120. However, instead of counting up to the hysteresis value 118, the circuit 100, in this embodiment, counts down to the reference value 130.

At clock cycle 7, the input signal 102 goes low, and remains low for clock cycles 8-10. As such, the value 205 stored in the register 110 is decremented for each of the clock cycles until the value 205 stored in the register 110 reaches the reference value 130 at clock cycle 10. During this decrementation, the hysteresis comparator output signal 122 goes low at clock cycle 8. Because both the hysteresis comparator output signal 122 and the reference comparator output signal 132 are logic low at clock cycle 8, the output flip-flop 124 maintains its current output, which is the high output signal 120 resulting from the set condition occurring at clock cycle 7. Thus, the output signal 120 remains logic high for clock cycles 8 and 9, as shown in FIG. 2A. However, when the value 205 stored in the register 110 equals the reference value 130 at clock cycle 10, the reference comparator output signal 132 goes high, resulting in a reset of the output flip-flop 124. Consequently, the output signal 120 goes low at clock cycle 10, as illustrated in FIG. 2A. The changed state (logic low) again becomes the original state for purposes of determining a subsequent change in the state of the output signal 120, and the circuit 100 again counts up to the hysteresis value 118.

The waveforms of the signals illustrated in FIG. 2A demonstrate that the disclosed deglitcher circuit 100 provides an accurate, time-shifted reconstruction of the input signal 102. The input signal 102 provides a logic low input for four clock cycles, a logic high input for four clock cycles, and a logic low input for three clock cycles. The output signal 120 provides an exact reconstruction of the input signal 102, wherein the output signal 120 is time-shifted by three clock cycles. As explained above, the three-clock-cycle-time-shift is due to the difference between the hysteresis value 118 and reference value 130 being three clock cycles.

The graphs provided in FIGS. 3A and 3B represent operation of the example deglitcher circuit 100 for a period of 10 clock cycles. FIG. 3A illustrates the input signal 102 provided in FIG. 2A with a positive glitch occurring at the sampled input at clock cycle 1. The example embodiment illustrated in FIGS. 3A and 3B demonstrates that the disclosed deglitcher circuit 100 filters positive glitches to produce an accurate, time-shifted reconstruction of the input signal 102 without the positive glitches. At clock cycle 0, the original state of the input signal 102 is low, and the value 405 stored in the register 110 is equal to the reference value 130. Therefore, the reference comparator output signal 132 is logic high, resulting in a low output signal 120, as shown in FIG. 3A.

At clock cycle 1, a changed state is sampled when the input signal 102 goes high. However, the input signal 102 returns low again before clock cycle 2. As such, the count is incremented for the changed input state sampled at clock cycle 1, but is decremented by the original input state sampled at clock cycle 2. The high input signal 102 sampled at clock cycle 1 causes an incrementation of the value 305 stored in the register 110, thereby causing the reference comparator output signal 132 to go low. Since the hysteresis comparator output signal 122 does not go high, the output signal 120 remains low and, thus, is unaffected by the changed state sampled at clock cycle 1. Accordingly, the changed state is considered a glitch, and is not reconstructed on the output signal 120. At clock cycle 2, the sampled input signal 102 is low again causing the value 305 stored in the register 110 to be decremented, thereby resulting in a high reference comparator output signal 132 at clock cycle 3, as shown in FIG. 3A.

For clock cycles 3-10, the input signal 102 is identical to that illustrated in FIGS. 2A and 2B and as described above. Therefore, for clock cycles 3-10, the deglitcher circuit 100 operates as described above in accordance with FIGS. 2A and 2B. The waveforms of the signals illustrated in FIG. 3A demonstrate that the disclosed deglitcher circuit 100 provides an accurate, time-shifted reconstruction of the input signal 102, even when the input signal 102 contains a positive glitch. The output signal 120 provides an exact reconstruction of the input signal 102 without the glitch, wherein the output signal 120 is time-shifted by three clock cycles. Again, the three-clock-cycle-time-shift is a result of the difference between the hysteresis value 118 and reference value 130 being three clock cycles.

The graphs provided in FIGS. 4A and 4B illustrate operation of the example deglitcher circuit 100 for a period of 12 clock cycles. The input signal 102 provided in FIG. 4A has a negative glitch detected at clock cycle 7. The waveforms of the signals illustrated in FIG. 4A demonstrate that the disclosed deglitcher circuit 100 provides an accurate, time-shifted reconstruction of the input signal 102, even when the input signal 102 contains a negative glitch. The output signal 120 provides an exact reconstruction of the input signal 102 without the glitch, wherein the output signal 120 is time-shifted by three clock cycles.

When observing the behavior of the signals illustrated in FIGS. 2A, 3A, and 4A, it is apparent that the output signal 120 changes states when either the hysteresis comparator output signal 122 goes high or the reference comparator output signal 132 goes high. Considering that the hysteresis comparator output signal 122 and the reference comparator output signal 132 only go high when a particular value is stored in the register, this suggests that the criteria for providing a particular output signal 120 may be controlled by the hysteresis value 118, the reference value 130, and, to some extent, the value stored in the register 110 at reset. The thresholds provided by the hysteresis value 118 and the reference value 130 require a given number of expected input signal samples over a period of time to activate either the hysteresis comparator output signal 122 or the reference comparator output signal 132. Thus, by setting the initial register value, the hysteresis value 118, and the reference value 130, the user can control how many low input signal 102 samples must be collected over a period of time to produce a low output signal 120, and how many high input signal 102 samples must be collected over a period of time to produce a high output signal 120.

Figure 5A:
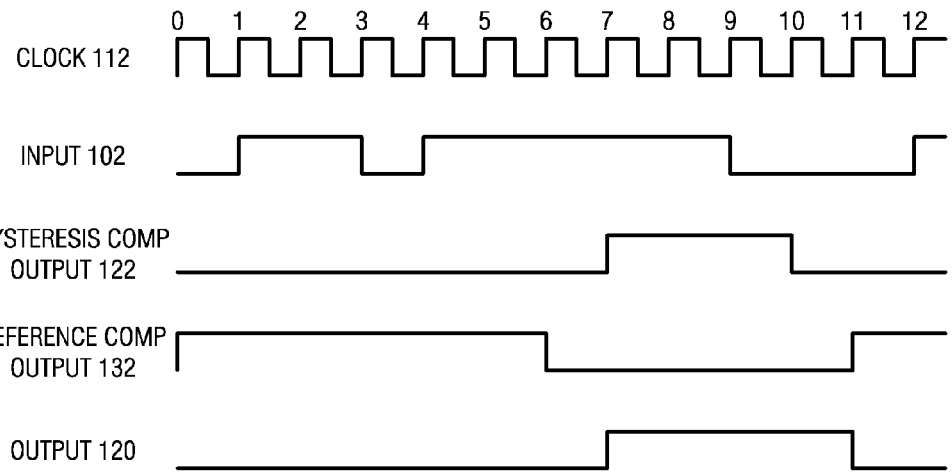
FIG. 5A illustrates a waveform drawing of an example embodiment wherein the initial register value is set to a number less than the reference value to create a higher threshold for producing an initial logic high output signal.
Figure 5B:
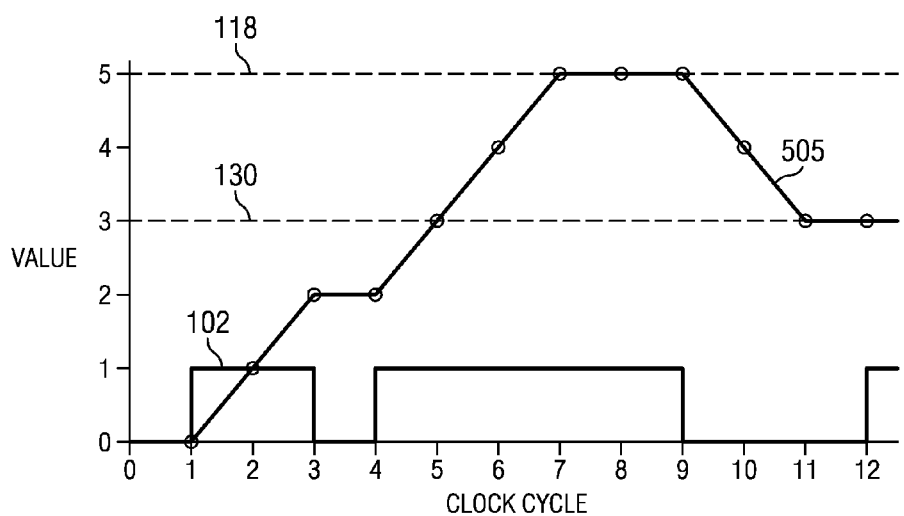
FIG. 5B illustrates a graph of the input signal waveform of FIG. 5A as well as a graph of the corresponding value stored in the register.

In view of the foregoing, other embodiments of the disclosed deglitcher circuit 100 may be implemented without departing from the scope of the present disclosure as set forth in the claims below. For example, in some embodiments, the user may wish to create a higher threshold for producing an initial logic high output signal 120 while maintaining the same difference between the upper and lower thresholds. This may be done by increasing both the hysteresis value 118 and the reference value 130 by the same value or, alternatively, by setting the initial register value (i.e., the value stored in the register 110 at clock cycle 0) to a value less than the reference value 130. This embodiment is illustrated in FIGS. 5A and 5B, wherein the hysteresis value 118 is set to five, the reference value 130 is set to three, and the initial register value 505 is set to zero. This embodiment requires a greater number of logic high input signal samples before a logic high output signal 120 is produced, but does not require a greater number of logic low input signal samples to achieve a low output signal 120. Once the lower threshold (i.e., the reference value 130) is exceeded, the circuit 100 operates as explained above with respect to FIGS. 2A, 2B, 3A, 3B, 4A, and 4B. The present example illustrates the register 110 storing values ranging from 0 to 5. Therefore, the register 110 is at least three bits wide since, n=3 for $5 \leq 2^n-1$. It should be noted that because the register 110 is three bits wide, it may actually store a maximum value of seven. This example illustrates that the disclosed deglitcher circuit 100 only requires three bits of storage, whereas a conventional deglitcher circuit would require seven bits to store the same range of values. Although it is not illustrated, other example embodiments may include requiring a greater number of low input signal samples to achieve an initial low output signal 120 while maintaining the same difference between the upper and lower thresholds. This may be accomplished by setting the initial register value to a number greater than the hysteresis value 118.

What is claimed is:

1. A deglitcher circuit comprising:
    a first multiplexer operable to receive an input signal and load a first value in a memory when said input signal is high, and load a second value in said memory when said input signal is low, wherein said loaded value is stored in said memory responsive to a clock signal;
    a first comparator operable to compare said stored memory value to an upper threshold value and output a first comparator signal;
    a second comparator operable to compare said stored memory value to a lower threshold value and output a second comparator signal; and
    a flip-flop operable to set when said first comparator signal is a first state and reset when said second comparator signal is a second state;
    wherein said first value is an incrementation of said stored memory value when said first comparator signal is a third state, and said second value is a decrementation of said stored memory value when said second comparator signal is a fourth state.

2. The deglitcher circuit as set forth in claim 1, wherein said first comparator signal is said first state when said stored memory value is greater than or equal to said upper threshold value.

3. The deglitcher circuit as set forth in claim 1, wherein said second comparator signal is said second state when said stored memory value is less than or equal to said lower threshold value.

4. The deglitcher circuit as set forth in claim 1, wherein said stored memory value is output on a data bus.

5. The deglitcher circuit as set forth in claim 4, wherein said data bus is at least n bits wide, wherein n is the minimum number of bits required to represent the largest value stored in said memory.

6. The deglitcher circuit as set forth in claim 1, wherein said memory is a register having a width of at least n bits, wherein n is the minimum number of bits required to represent the largest value stored in said memory.

7. The deglitcher circuit as set forth in claim 1, wherein said memory is preloaded with a value less than said lower threshold value.

8. The deglitcher circuit as set forth in claim 1, wherein said memory is preloaded with a value greater than said upper threshold value.

9. The deglitcher circuit as set forth in claim 1, wherein the difference between the upper threshold value and the lower threshold value defines a time-shift of the output signal relative to said input signal.

10. The deglitcher circuit as set forth in claim 1, wherein at least one of said upper and lower threshold values are user-programmable.

11. The deglitcher circuit as set forth in claim 1, wherein said upper threshold value is the minimum stored memory value for which said first comparator signal is said first state.

12. The deglitcher circuit as set forth in claim 1, wherein said lower threshold value is the maximum stored memory value for which said second comparator signal is said second state.

13. The deglitcher circuit as set forth in claim 1, wherein said first state is opposite said third state, and said second state is opposite said fourth state.

14. An apparatus sampling an input signal, said apparatus comprising:
a counter operable to increment when said input signal is sampled in a first logic state and said counter is less than an upper threshold value, and further operable to decrement when said input signal is sampled in a second logic state and said counter is greater than a lower threshold value; and
output circuitry operable to set responsive to said counter being greater than or equal to said upper threshold value, and reset responsive to said counter being less than or equal to said lower threshold value.

15. The apparatus as set forth in claim 14, wherein said counter outputs a counter value on a data bus.

16. The apparatus as set forth in claim 15, wherein said data bus is at least n bits wide, wherein n is the minimum number of bits required to represent the largest counter value.

17. The apparatus as set forth in claim 14, wherein said counter has a width of at least n bits, wherein n is the minimum number of bits required to represent the largest value stored in said counter.

18. The apparatus as set forth in claim 14, wherein said counter contains a value less than said lower threshold value.

19. The apparatus as set forth in claim 14, wherein said counter contains a value greater than said upper threshold value.

20. The apparatus as set forth in claim 14, wherein the difference between the upper threshold value and the lower threshold value defines a time-shift of the output signal relative to the input signal.

21. The apparatus as set forth in claim 14, wherein at least one of said upper and lower threshold values are user-programmable.

22. The apparatus as set forth in claim 14, wherein said upper threshold value is the minimum counter value for which said output circuitry is set.

23. The apparatus as set forth in claim 14, wherein said lower threshold value is the maximum counter value for which said output circuitry is reset.

24. A method for filtering glitches in a digital signal, the method comprising the following steps:
(a) sampling an input signal;
(b) comparing data stored in memory with high and low threshold values;
(c) outputting a first state output signal when said data is greater than or equal to said high threshold value;
(d) maintaining said first state output signal until said data stored in said memory is less than or equal to said low threshold value;
(e) outputting a second state output signal when said data is less than or equal to said low threshold value;
(f) maintaining said second state output signal until said data stored in said memory is greater than or equal to said high threshold value;
(g) incrementing the data stored in said memory if said data is less than said high threshold value when said sampled input signal is a third state;
(h) decrementing the data stored in said memory if said data is greater than said low threshold value when said sampled input signal is a fourth state; and
(i) repeating steps (b) through (h).

25. The method as set forth in claim 24, wherein said output signal represents a filtered and time-shifted reconstruction of the sampled input signal.

26. The method as set forth in claim 24, wherein at least one of said high and low threshold values are user-programmable.

27. The method as set forth in claim 24, further comprising adjusting said first and second threshold values to bias said output signal.

28. The method as set forth in claim 24, further comprising preloading a value in said memory to bias said output signal.

29. The method as set forth in claim 24, wherein the difference between said first and second threshold values defines a time-shift of the output signal relative to said input signal.

30. The method as set forth in claim 24, further comprising adjusting said first and second threshold values to adjust a time-shift of the output signal relative to said input signal.

31. The method as set forth in claim 24, wherein said first state is opposite said second state, and said third state is opposite said fourth state.

32. A method comprising:
receiving an upper threshold value;
receiving a lower threshold value;
storing a value loaded in a memory at a first clock cycle and outputting said stored value on a data bus;
sampling an input signal;
comparing said data bus value to said upper threshold;
setting a flip-flop if said data bus value is greater than or equal to said upper threshold;
incrementing said data bus value if said data bus value is less than said upper threshold;
loading said incremented data bus value in said memory if said sampled input signal is a first state;
comparing said data bus value to said lower threshold;
resetting a flip-flop if said data bus value is less than or equal to said lower threshold;
decrementing said data bus value if said data bus value is greater than said upper threshold;
loading said decremented data bus value in said memory if said sampled input signal is a second state;
outputting a high signal when said flip-flop is set; and
outputting a low signal when said flip-flop is reset.

33. The method as set forth in claim 32, wherein said first threshold value is user-programmable.

34. The method as set forth in claim 32, wherein said second threshold value is user-programmable.

35. A method for filtering an input signal and producing an output signal, the method comprising:
sampling an input signal which is changeable from an original state to a changed state;
incrementing a counter in response to sampling the input signal at said changed state;
decrementing said counter in response to sampling the input signal at said original state; and
changing the state of said output signal when said counter reaches a first threshold value.

36. The method as set forth in claim 35, further comprising:
responsive to a change in state of said output signal, decrementing said counter in response to sampling the input signal at said changed state;
incrementing said counter in response to sampling the input signal at said original state; and
changing the state of said output signal when said counter reaches a second threshold value.

37. The method as set forth in claim 35, wherein said output signal represents a filtered and time-shifted reconstruction of the sampled input signal.

38. The method as set forth in claim 35, wherein said first threshold value is user-programmable.

39. The method as set forth in claim 36, wherein said second threshold value is user-programmable.

40. The method as set forth in claim 36, further comprising adjusting said first and second threshold values to bias said output signal.

41. The method as set forth in claim 35, further comprising preloading a value in said counter to bias said output signal.

* * * * *